US009111774B2

(12) United States Patent
Chang et al.

(10) Patent No.: US 9,111,774 B2
(45) Date of Patent: *Aug. 18, 2015

(54) WAFER-TO-WAFER STACK WITH SUPPORTING POST

(71) Applicant: INDUSTRIAL TECHNOLOGY RESEARCH INSTITUTE, Hsinchu (TW)

(72) Inventors: Chi-Shih Chang, Hsinchu (TW); Ra-Min Tain, Hsinchu (TW); Shyi-Ching Liau, Hsinchu (TW); Wei-Chung Lo, Hsinchu (TW); Rong-Shen Lee, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/774,939

(22) Filed: Feb. 22, 2013

(65) Prior Publication Data

US 2013/0161829 A1    Jun. 27, 2013

Related U.S. Application Data

(62) Division of application No. 13/424,926, filed on Mar. 20, 2012, now abandoned, which is a division of application No. 11/471,165, filed on Jun. 20, 2006, now Pat. No. 8,164,165.

(30) Foreign Application Priority Data

Oct. 26, 2005    (TW) ................................ 94137522 A (51) Int. Cl.
| | |
|---|---|
| H01L 29/40 | (2006.01) |
| H01L 25/065 | (2006.01) |
| H01L 23/498 | (2006.01) |
| H01L 23/48 | (2006.01) |
| H01L 23/00 | (2006.01) |
| H01L 23/552 | (2006.01) |
| H01L 23/60 | (2006.01) |
| H01L 23/64 | (2006.01) |

(52) U.S. Cl.
CPC .......... *H01L 25/0657* (2013.01); *H01L 23/481* (2013.01); *H01L 23/49827* (2013.01); *H01L 23/562* (2013.01); *H01L 24/94* (2013.01); *H01L 23/552* (2013.01); *H01L 23/60* (2013.01); *H01L 23/642* (2013.01); *H01L 2225/06513* (2013.01); *H01L 2225/06541* (2013.01); *H01L 2225/06572* (2013.01); *H01L 2924/01005* (2013.01); *H01L 2924/01006* (2013.01); *H01L 2924/01019* (2013.01); *H01L 2924/01033* (2013.01)

(58) Field of Classification Search
CPC ........... H01L 2225/06513; H01L 2225/06541; H01L 2225/06572; H01L 23/481; H01L 23/49827; H01L 23/552; H01L 23/562; H01L 23/60; H01L 23/642; H01L 24/94; H01L 25/0657; H01L 2924/01005; H01L 2924/01006
USPC ............. 257/621, 74, 278, 686, E23.011, 774
See application file for complete search history.

(56) References Cited

U.S. PATENT DOCUMENTS

| | | | | |
|---|---|---|---|---|
| 8,164,165 | B2 * | 4/2012 | Chang et al. | 257/621 |
| 2003/0129829 | A1 * | 7/2003 | Greenlaw | 438/637 |

(Continued)

*Primary Examiner* — Thanh T Nguyen
(74) *Attorney, Agent, or Firm* — Birch, Stewart, Kolasch & Birch, LLP (57) ABSTRACT

A wafer stack includes: a first wafer having a first substrate and a first device layer having therein at least a chip; a second wafer having a second substrate disposed above the first wafer; and at least a first metal post existing in the first device layer, and arranged between the first and the second substrates, without being electrically connected to the chip.

35 Claims, 7 Drawing Sheets

(56) References Cited

U.S. PATENT DOCUMENTS

| | | |
|---|---|---|
| 2003/0157748 A1* | 8/2003 | Kim et al. .................... 438/107 |
| 2003/0178228 A1 | 9/2003 | Sung et al. |
| 2004/0178495 A1 | 9/2004 | Yean et al. |
| 2006/0043571 A1 | 3/2006 | Mousa et al. |
| 2006/0043573 A1 | 3/2006 | Hedler et al. |
| 2006/0057836 A1* | 3/2006 | Nagarajan et al. ............ 438/622 |
| 2006/0216857 A1* | 9/2006 | Zhao ............................ 438/106 |
| 2007/0235856 A1 | 10/2007 | Haba et al. |
| 2009/0209063 A1 | 8/2009 | Lee et al. |

\* cited by examiner

WAFER-TO-WAFER STACK WITH SUPPORTING POST

CROSS REFERENCE TO RELATED APPLICATIONS

The present application is a Divisional Application of U.S. application Ser. No. 13/424,926 filed on Mar. 20, 2012, which is a Divisional Application of U.S. application Ser. No. 11/471,165 filed on Jun. 20, 2006 (now U.S. Pat. No. 8,164, 165), and for which priority is claimed under 35 U.S.C. §120. This application also claims priority of Application No. 94137522 filed in Taiwan on Oct. 26, 2005 under 35 U.S.C. §119. The entire contents of all the above are hereby incorporated by reference.

FIELD OF THE INVENTION

The present invention relates to a wafer stack structure, and in particular to a three dimensional wafer stack having at least one supporting post formed therein.

BACKGROUND OF THE INVENTION

As the rapid development of the semiconductor process, more and more electronic products can be provided with higher performance, higher portability and more compactness. Under such a development trend, the size of the chip used for the electronic products should be miniaturized, but the integrated circuits contained in the chip are becoming more and more complicated. However, advancing scaling down of chip size and increasing the design complexity of the integrated circuits entail a multiplicity of problems, such as, the crosstalk effect and the thermal issues on the chip, or the proximity effect in the lithography and etching processes. Recently, a novel three dimensional wafer structure design has been gradually developed in order to overcome the problems resulting from the miniaturization of the chip Please refer to FIG. 1, which schematically shows a conventional three dimensional wafer stack structure according to the prior art. As can be seen from FIG. 1, a wafer stack 100' includes a first wafer 10', a second wafer 20' and a third wafer 30', each of which consists of a substrate 12', 22', 32' and a device layer 14', 24', 34'. Furthermore, there further exits a bonding layer 13' between two adjacent wafers for constructing the wafer stack. Specifically, the respective device layers of the first and the second wafers are arranged to configure them as a face to face wafer stack, while the respective device layers of the second and the third wafers are arranged to configure them as a back to face wafer stack. Furthermore, as can be seen from FIG. 1, each wafers 10', 20', 30' further has plural circuit devices 16', 26', 36' in the respective device layer 14', 24', 34', which are electrically interconnected through the signal vias 15'.

Figure 1:
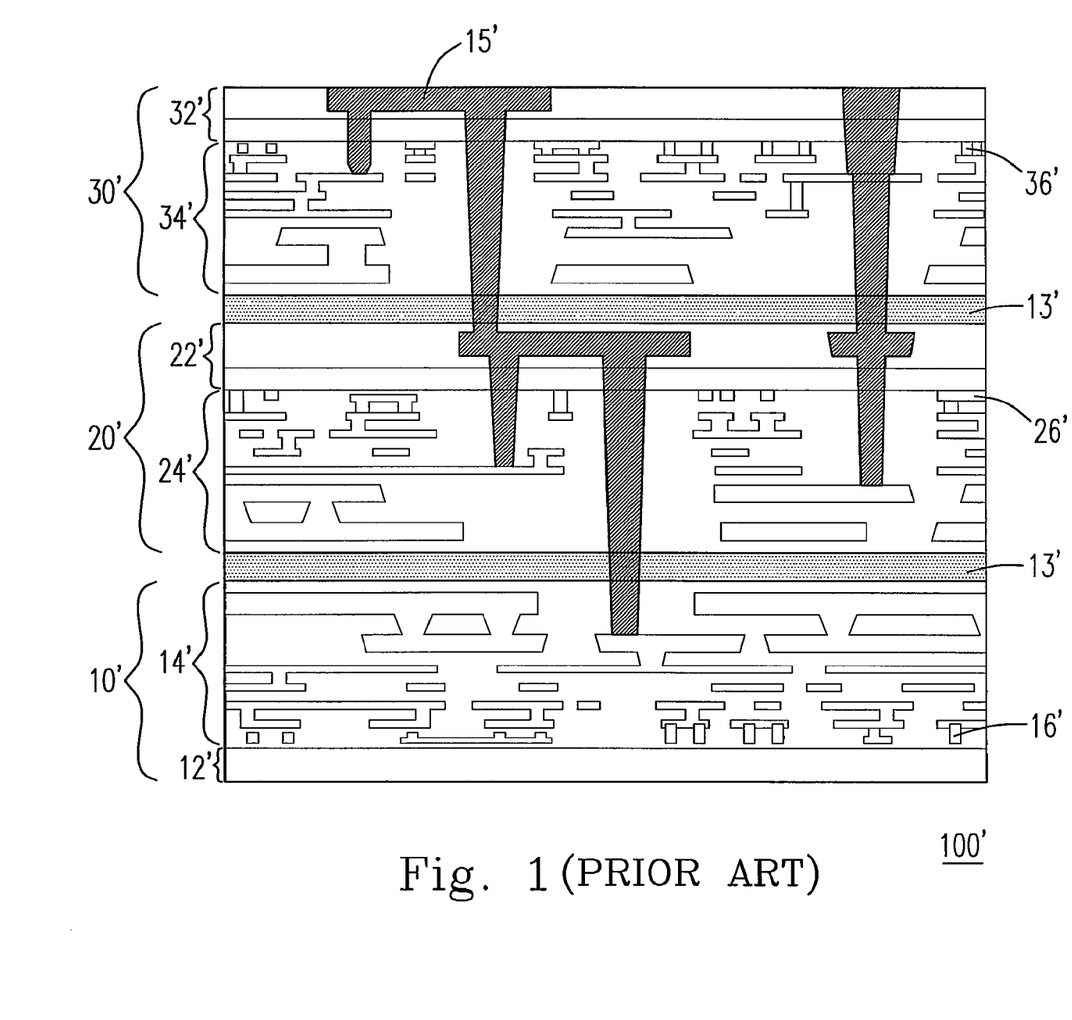
FIG. 1 is a diagram schematically illustrating a conventional three dimensional wafer stack according to the prior art.

In such a three dimensional wafer stack structure, like the abovementioned wafer stack 100', more wafers might be repeatedly stacked up, if necessary. However, a new problem may occur in such a three dimensional wafer stack structure. The low-k materials, which exist in the respective device layer and are used for allowing the conducting wires thereof being arranged closely, might be destroyed by compression stresses resulting from the stacking structure or by the thermal stresses resulting from the heat generated by the circuit devices.

Based on the above, it is necessary to find a new approach to prevent the low-k materials existing in the device layer from being damaged by the compression or thermal stresses.

In order to overcome such issues, a novel three dimensional wafer stack having therein at least one supporting post and the manufacturing method therefor are provided.

SUMMARY OF THE INVENTION

It is a first aspect of the present invention to provide a three dimensional wafer stack with at least one supporting post formed therein. The wafer stack includes a first wafer having a first substrate and a first device layer having thereon at least one chip, a second wafer disposed above the first wafer and having a second substrate, and at least one post arranged between and extending from the first substrate to the second substrate.

Preferably, the first and the second device layers are adjacent to each other, so as to configure the first and the second wafers as a face to face wafer stack.

Preferably, the second wafer has a second device layer and the post has a part formed in the first device layer and being vertically aligned with that formed in the second device layer.

Preferably, the first device layer is adjacent to the second substrate, so as to configure the first and the second wafers as a back to face wafer stack.

Preferably, the first substrate is adjacent to the second substrate, so as to configure the first and the second wafers as a back to back wafer stack.

Preferably, each of the first and the second wafers further includes a solid foundation made up by one selected from the group consisting of silicon substrate, silicon dioxide on silicon substrate and silicon nitride/silicon dioxide on silicon substrate.

Preferably, the post stands on the solid foundation.

Preferably, the wafer stack further includes a plurality of posts and all the posts are arranged in a pattern selected from a group consisting of a rectangular array, a peripheral array, and any other symmetrical array.

Preferably, the post is one of a columnar structure and a lateral structure.

Preferably, the post is formed by a metal material having a relatively high thermal conductivity.

Preferably, the post runs through the first and the second substrates.

Preferably, the first device layer comprises a low-k porous material.

Preferably, the device layer has a chip area forming thereon the chip and disposing thereon the post.

Preferably, the post is vertically arranged between the first and second substrates.

It is a second aspect of the present invention to provide a further three dimensional wafer stack with at least one supporting post formed therein. The wafer stack includes a first wafer having a first substrate and a first device layer, a second wafer disposed above the first wafer and having a second substrate and a second device layer, a first and a second circuits respectively disposed on the first and the second device layers, at least one via passing through the second substrate for electrically connecting the second circuit to the first device layer, and at least one post arranged on the first and the second circuits and vertically extending from the respective substrate to the respective device layer.

Preferably, the first and the second wafers have the same line width.

Preferably, the second wafer has a wider line width than that of the first wafer.

Preferably, the second circuit comprises one selected from a group consisting of an ESD circuit, a passive element circuit, a driving circuit and a power/ground shielding circuit.

It is a third aspect of the present invention to provide a further three dimensional wafer stack with at least one supporting post formed therein. The wafer stack includes a first wafer having a device layer arranging thereon at least one circuit and a substrate mounting thereon the first device layer, a second wafer disposed above the first wafer, and a supporting structure disposed between the first and the second wafers.

Preferably, the device layer has a circuit area arranging thereon the at least one circuit and the supporting structure.

Preferably, the supporting structure vertically extends from the substrate to the second wafer.

Preferably, the second wafer further includes a circuit layer, and the circuit layer is arranged to configure the first and the second wafers to be one of a face-to-face and a back-to-face wafer stacks.

Preferably, the supporting structure vertically passes through the device layer and the circuit layer.

Preferably, the supporting structure is one of a columnar structure and a lateral structure.

Preferably, the supporting structure runs through the substrate.

It is a fourth aspect of the present invention to provide a method for stacking a three dimensional wafer structure. The method includes the following steps of (a) providing a first wafer, (b) disposing a second wafer above the first wafer, (c) forming a supporting structure on the first wafer, (d) forming plural interconnecting vias running through the second wafer for electrically interconnecting opposite sides of the second wafer, and (e) bonding the first and the second wafers for completing the three dimensional wafer structure.

Preferably, the plural interconnecting vias are formed by one of processes selected from a group consisting of UV laser process, CO2 laser process, and chemical etching process.

Preferably, the method for stacking a three dimensional wafer structure further includes a step of filling up a part of the interconnecting vias with an electrically conductive material for electrically interconnecting both sides of the second wafer.

Preferably, the method for stacking a three dimensional wafer structure further includes a step of forming an insulator layer around side walls of the part of the interconnecting vias.

Preferably, the method for stacking a three dimensional wafer structure further includes a step of forming an electrically conductive layer on the second wafer.

It is a fifth aspect of the present invention to provide a further three dimensional wafer stack with a stress protection device formed therein. The wafer stack includes a first wafer having a device layer including at least one circuit and a substrate for mounting thereon the device layer, a second wafer disposed above the first wafer, and a stress protection device disposed between the first and the second wafers and vertically extended from the substrate to the second wafer.

It is a sixth aspect of the present invention to provide a further three dimensional wafer stack with a stress protection device formed therein. The wafer stack includes a first chip having a circuit layer including at least one circuit and a substrate for mounting thereon the circuit layer, a second chip disposed above the first chip, and a stress protection device disposed between the first and the second chips and vertically extended from the substrate to the second chip.

Based on the above, a novel three dimensional wafer stack structure and the manufacturing method therefor are provided. In Comparison with the conventional three dimensional wafer stack, the three dimensional wafer stack structure according to the present invention is further provided with at least one post arranged in each chip area of the device layer for preventing the low-k materials existing in the device layer from being damaged by the stresses. Moreover, the posts, which are usually formed by a metal material having a relatively high thermal conductivity, constructed by a columnar structure or a lateral structure, and can run through the first and the second substrates, are also used as the thermal conductive devices, in order to release the heat generated in the device layers.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Please refer to FIGS. 2(A)-2(D), which respectively shows the different embodiments of the three dimensional wafer stack according to the present invention. As can be seen from FIG. 2(A), the three dimensional wafer stack 100 according to a first embodiment of the present invention includes a first wafer 10 and a second wafer 20, both of which are arranged face-up, so as to configure the first and the second wafers 10, 20 as a back to face (or back to front) wafer stack. Specifically, the first and the second wafers 10, 20 further include a first and a second substrates 12, 22 as well as a first and a second device layers 14, 24, respectively. In each of the first and the second device layers, a plurality of circuit devices 16, 26, which are generally designed to be the integrated circuit chips, and at least one low-k layers 18, 28 are formed therein. Typically, the low-k layers 18, 28 are made of the conventional low-k material, such as silicon dioxide, or the porous materials. Moreover, in order to electrically interconnect the respective circuit devices 16, 26 arranged in the first and the second wafers 10, 20, at least one signal via 15 is formed therebetween, so that the respective circuit devices 16, 26 in the wafers 10, 20, could be electrically interconnected to each other.

Figure 2A:
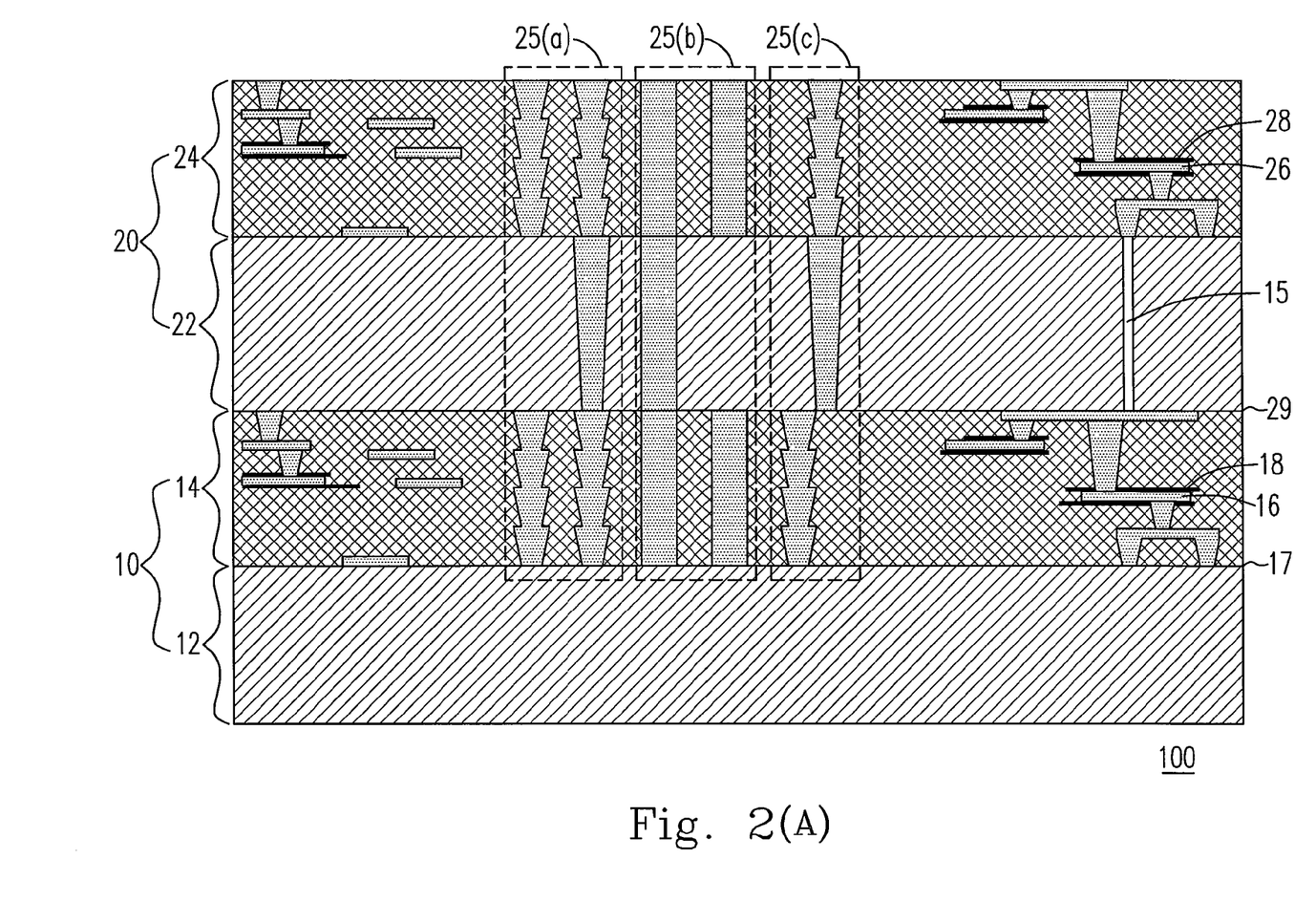
FIG. 2(A) is a diagram schematically illustrating a three dimensional wafer stack according to a first embodiment of the present invention.

In addition to the above-mentioned structural feature, the three dimensional wafer stack 100 according to the first embodiment of the present invention further includes at least one supporting structure 25, such as a post, existing in the first and the second device layers 12, 22 for preventing the low-k layers 18, 28, from being damaged by the compression stresses resulting from the stacking of the wafers or the thermal stresses generated from the heat generated by the circuit devices 16, 26.

As shown in FIG. 2(A), the supporting structure 25 is arranged on the location of the circuit devices (i.e. the chip area in the device layer) and stands on a solid foundation, which is made up by either the silicon substrate, the silicon dioxide on silicon substrate and the silicon nitride/silicon dioxide on silicon substrate, and extends vertically upward to a further rigid surface, which is made of the same materials as those forming the solid foundation. However, the solid foundation or the rigid surface excludes the silicon dioxide or the silicon nitride existing in the low-k layers 18, 28, which is used for the wiring purpose. Furthermore, in a preferred embodiment, the supporting structure 25 may run through the first and/or the second substrates 12, 22 for mitigating the possible stress impact resulting from the deformation of the respective substrates.

Moreover, as shown in FIG. 2(A), the supporting structure 25 in such a back to face wafer stack 100 can be arranged to be different configurations (a)-(c). In configuration (a), the supporting structure 25 in the respective device layers 14, 24 is fabricated through a layer-by-layer deposition process, so that the supporting structure in the device layer is configured as a layer-by-layer supporting structure which is vertically aligned and extending upward in each wafer. In configuration (b), the supporting structure is formed within a through hole which is fabricated by means of a drilling process or an etching process. In configuration (c), it shows that the supporting structure in each wafer should be vertically aligned, including the part of the supporting structure running through the substrate 22. However, the part of the supporting structure in the first wafer 10 is not necessary to be vertically aligned with that formed in the second wafer 20. That is to say that the supporting structures in each wafer can be designed and arranged independently in such back to face wafer stack.

Figure 2B:
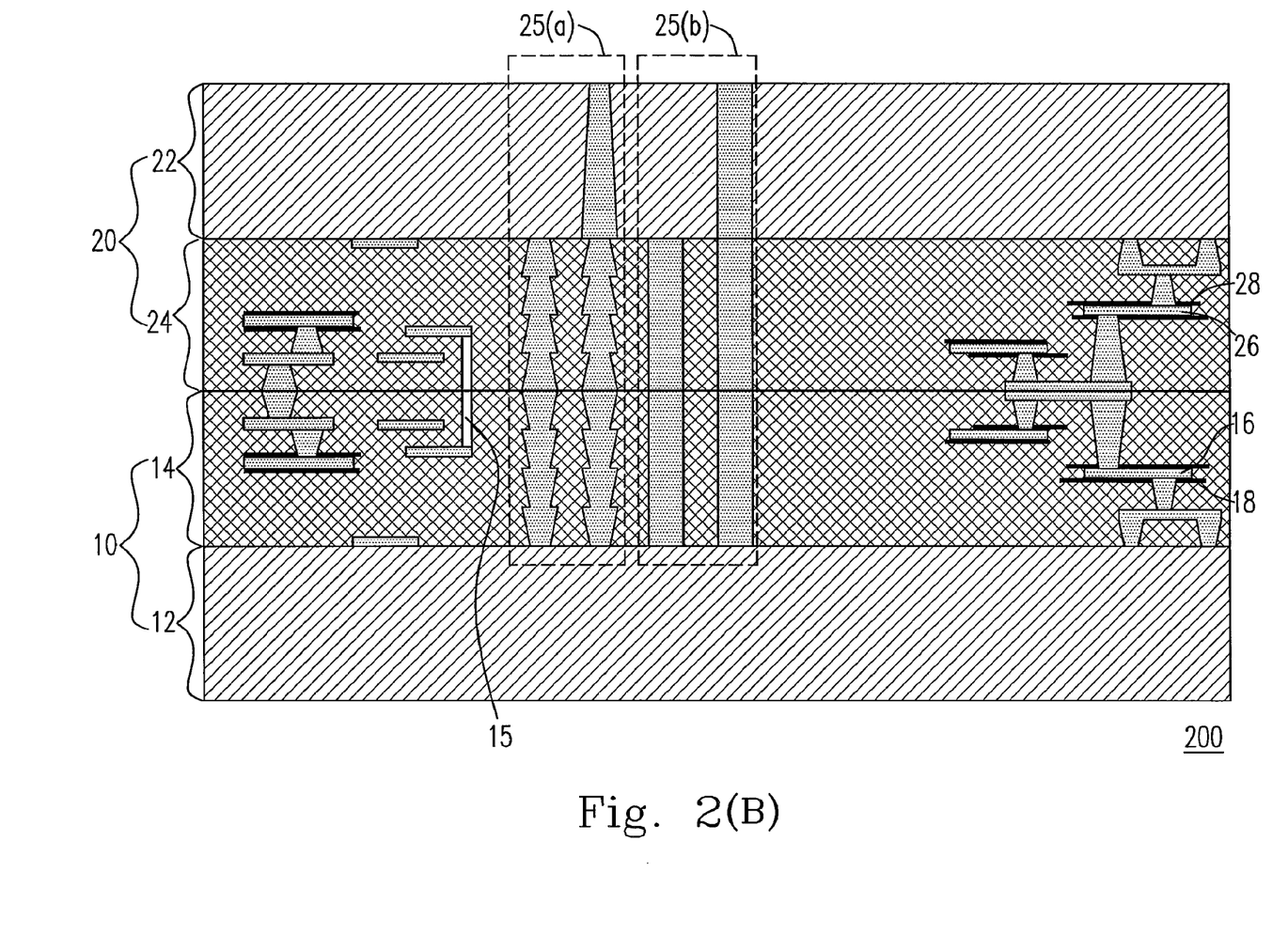
FIG. 2(B) is a diagram schematically illustrating a three dimensional wafer stack according to a second embodiment of the present invention.

Please further refer to FIG. 2(B), which shows a further face to face wafer stack according to the second embodiment of the present invention. In comparison with the back to face wafer stack 100 as shown in FIG. 2(A), the second wafer 20 is arranged face down, so as to configure the first and the second wafers 10, 20 as a face to face wafer stack 200. Since the second wafer is arranged face down, the device layer 24 of the second wafer 20 is adjacent to the device layer 14 of the first device wafer 10. Accordingly, not only the thickness of the first and the second device layers but also the interconnection distance between the circuit devices (or chips) 16, 26 in the respective device layers 14, 24 can be remarkably reduced. Similarly, the supporting structure 25 in the face to face wafer stack can be arranged to be different configurations (a) and (b) as shown in FIG. 2(B). In configuration (a), the supporting structure 25 is similarly fabricated through a layer-by-layer deposition process, and the layer-by-layer supporting structure is vertically aligned and extending upward in the respective wafers 10, 20. The supporting structure 25 also can run through the first and/or the second substrates 12, 22 for mitigating the possible stresses impact resulting from the deformation of the respective substrates 12, 22. However, it should be noted that the part of the supporting structure running through the substrate is formed through the drilling process or the etching process rather than the deposition process. Furthermore, in configuration (b), the supporting structure is similarly formed within a through hole which is fabricated by means of a drilling process or an etching process, as described in the first embodiment. It also should be noted that the supporting structures formed in each wafer of the face to face wafer stack 200 should be arranged to be vertically aligned, so as to provide an enforceable support in the first and the second device layers. Therefore, the configuration (c) as shown in FIG. 2(A) is incapable of being applied in such face to face wafer stack 200.

Figure 2C:
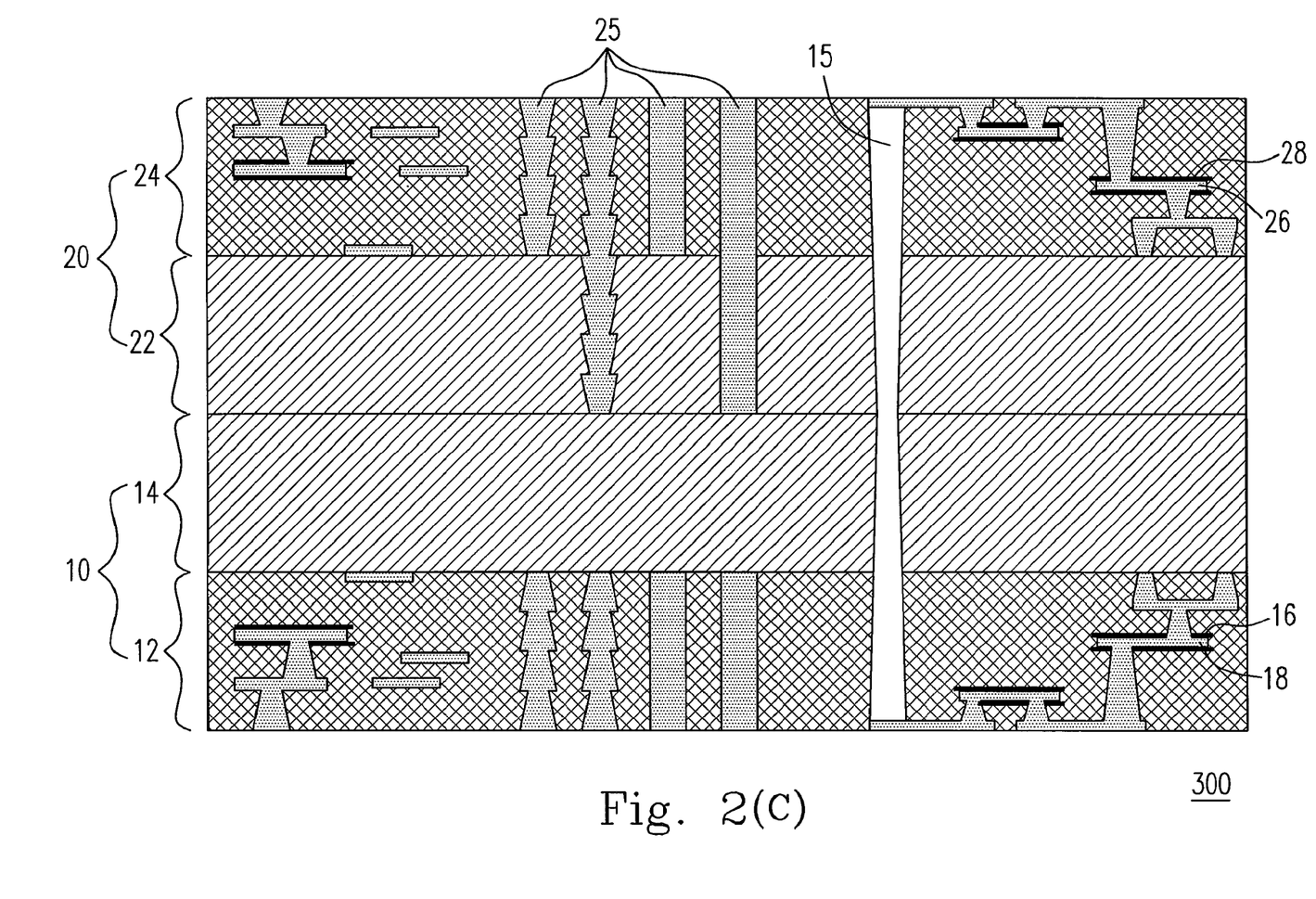
FIG. 2(C) is a diagram schematically illustrating a three dimensional wafer stack according to a third embodiment of the present invention.
Figure 2D:
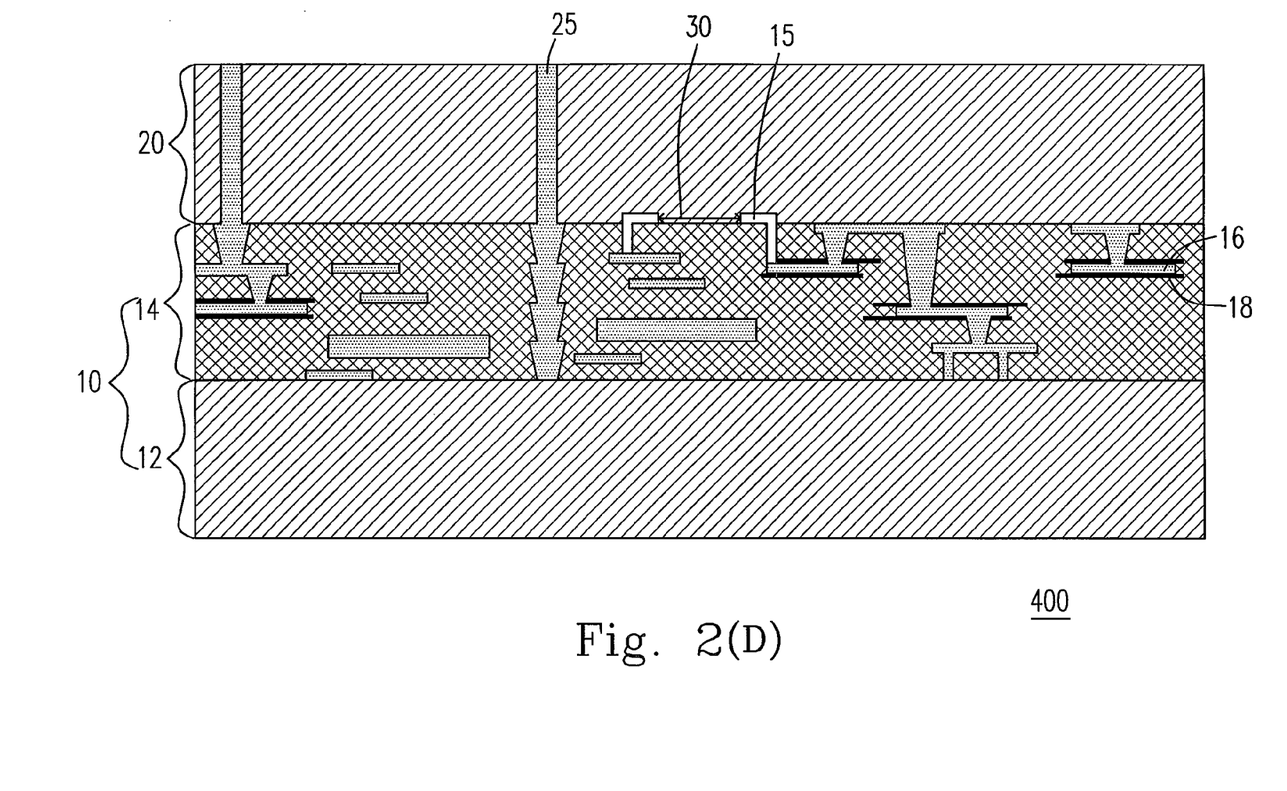
FIG. 2(D) is a diagram schematically illustrating a three dimensional wafer stack according to a fourth embodiment of the present invention.

Please refer to FIG. 2(C), which shows a further back to back wafer stack according to the third embodiment of the present invention. In comparison with the back to face wafer stack 100 and the face to face stack 200, as shown in FIG. 2(A) and FIG. 2(B), respectively, the back to back wafer stack 300 according to the third embodiment of the present invention has almost the same components as those described in the first and the second embodiments. However, the only difference is that the first wafer 10 is arranged face down while the second wafer is arranged face up, so that the three dimensional wafer stack shown in FIG. 2(C) is configured as a back to back wafer stack. Although the back to back wafer stack 300 has a longer interconnection distance than the back to face wafer stack 100 and the face to face wafer stack 200, it is especially advantageous when the first and the second wafers are applied in different line width processes. Therefore, the back to back wafer stack 300 is also applicable to the certain cases in which the first and the second wafers are suitable for being applied in different line width processes Please refer to FIG. 2(D), which shows a further three dimensional wafer stack according to a fourth embodiment of the present invention. The wafer stack 400 according to the fourth embodiment of the present invention is an alternative embodiment of the face to back wafer stack 100 according to the first embodiment of the present invention, except the second wafer thereof is a dummy wafer, which has no device layer and no circuit device formed therein. Accordingly, the second wafer 40 in this embodiment is used for the protection or wiring purpose or used for electrically connecting with some core circuit which is applied in a lower resolution (wider line width) process, such as an ESD circuit, a passive element circuit, a driving circuit and a power/ground shielding circuit 30. However, it should be noted that the structural features of the supporting structure in this embodiment are almost similar to or compatible with those formed in the abovementioned embodiments.

Figure 3A:
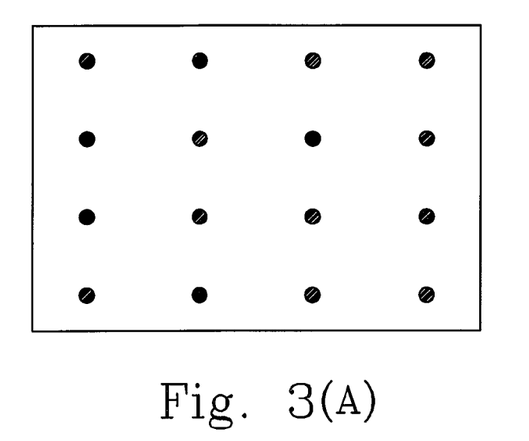
FIGS. 3(A) and 3(B) are top view diagrams schematically illustrating the arrangement patterns of the posts in each chip area.
Figure 3B:
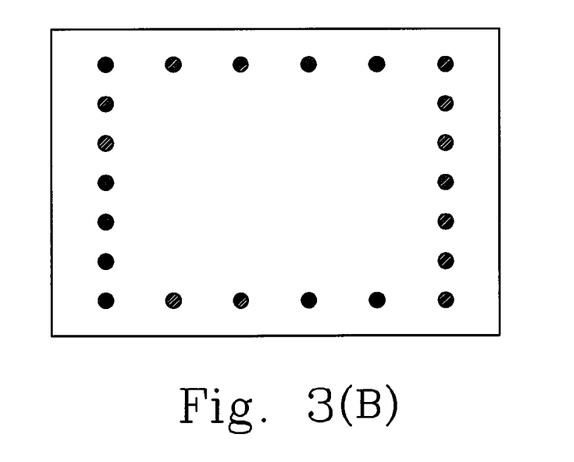

Please further refer to FIGS. 3(A) and 3(B), which respectively shows the top view diagrams of the exemplary arrangement patterns of the posts in each chip area (or in each circuit device area) of the device layer. As shown in FIG. 3 (A) and FIG. 3(B), when there exist a plurality of supporting structures (or posts) in each device layer, the supporting structures in each chip area (or circuit device area) are arranged in a pattern, such as the rectangular array (shown in FIG. 3(A)), the peripheral array (shown in FIG. 3(B)), or even any other symmetrical array.

In addition, the supporting structures in an alternative embodiment can be designed to include a columnar structure part and a lateral structure part, as shown in FIGS. 2(A)-2(D). Moreover, the supporting structures are made of the metal material having a relatively high thermal conductivity for enhancing the heat conduction in those three dimensional wafer stacks 100-400. In addition to the abovementioned design, in such a case that the supporting structure running through the respective substrates of the wafers, the heat generated in the respective device layers can be effectively transferred to the outside of the wafer stack.

Figure 4:
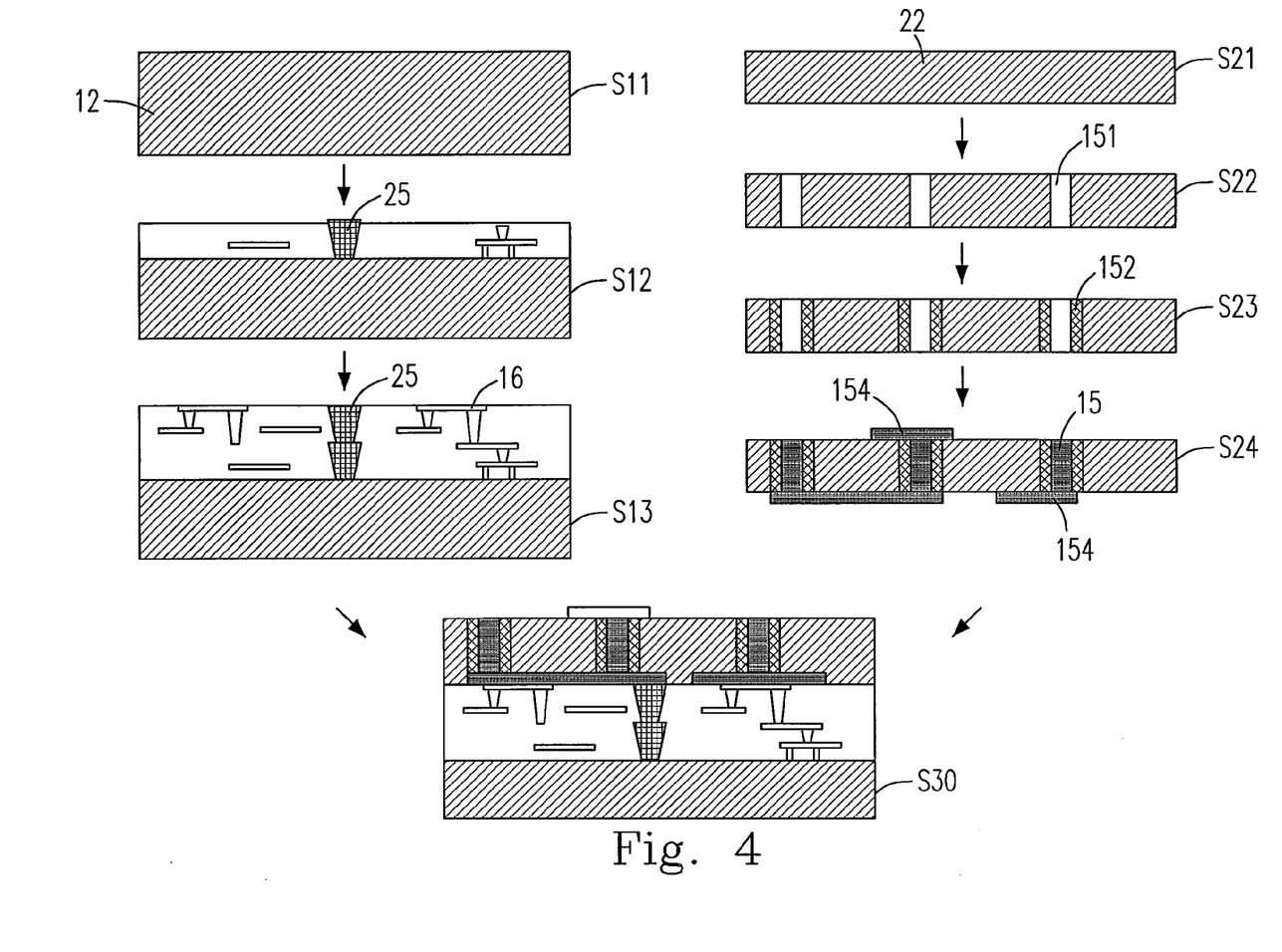
FIG. 4 is a flowchart of a method for manufacturing the three dimensional wafer stack according to the present invention.

Please refer to FIG. 4 which shows a flowchart of a method for manufacturing a three dimensional wafer stack according to the present invention. As described in the abovementioned embodiments, the wafer stack according to the present invention is exemplarily formed by a first and a second wafers which are applied to an identical line width process or the different line width processes. As shown in FIG. 4, the first and the second wafers are first processed independently, and then bonded to each other. In step S11, a substrate of a first wafer is provided. In steps S12 and S13, the circuit devices 16 together with the dielectric layers and the supporting structures 25 are formed on the substrate 12 through the layer-by-layer deposition process. On the other hand, in step S21, a substrate 22 of a second wafer is provided. In step S22, a plurality of through holes 151 is formed on the substrate 22 through a chemical etching process or a drilling process, such as a UV laser process or a $CO_2$ laser process. In Step S23, an insulator layer 152 is formed around the side walls of the through holes. In step S24, the through holes 151 are filled up with an electrically conductive material 15, so as to electrically interconnect the both sides of the second wafer. In a preferred embodiment, the step S24 further include the step of forming an electrically conductive layer 154 on one side or both sides of the second wafer, so as to make the circuit devices in each side be electrically interconnected with each other. After finishing the respective processes of the first and the second wafers, the substrate 22 of the second wafer is bonded to the device layer of the first wafer, so as to complete the three dimensional wafer structure, as shown in step S30 of FIG. 4. Accordingly, the three dimensional wafer stack with the supporting structure is manufactured thereby. In addition thereto, it should be noted that the abovementioned three dimensional wafer stack can be extended to a three dimensional chip stack with the supporting structures formed therein, so as that a novel chip stack having a stress protecting device and a novel chip stack with a supporting structure can be further provided.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A wafer stack, comprising:
   a first wafer having a first substrate and a first device layer having therein at least a circuit device;
   a second wafer having a second substrate disposed above the first wafer; and
   at least a first metal post existing in and penetrating through the entire first device layer, and arranged between the first and the second substrates, without being electrically connected to the circuit device.

2. The wafer stack according to claim 1, wherein the second wafer has a second device layer and the metal post has a part in the first device layer and is vertically aligned with a part of the metal post that is formed in the second device layer.

3. The wafer stack according to claim 2, wherein the first and the second device layers are adjacent to each other, so as to configure the first and the second wafers as a face to face wafer stack.

4. The wafer stack according to claim 1, wherein the first device layer is adjacent to the second substrate, so as to configure the first and the second wafers as a back to face wafer stack.

5. The wafer stack according to claim 1, wherein the first substrate is adjacent to the second substrate, so as to configure the first and the second wafers as a back to back wafer stack.

6. The wafer stack according to claim 1, wherein a second substrate includes a rigid layer, and the rigid layer is made up by one selected from the group consisting of silicon substrate, silicon dioxide on silicon substrate and silicon nitride/silicon dioxide on silicon substrate.

7. The wafer stack according to claim 6, wherein the first metal post stands on a solid foundation layer of the first substrate.

8. The wafer stack according to claim 1 further comprising a plurality of the first metal posts.

9. The wafer stack according to claim 8, wherein all the first metal posts are arranged in a pattern selected from a group consisting of a rectangular array, a peripheral array, and a symmetrical array.

10. The wafer stack according to claim 1, wherein the first metal post is one of a columnar structure and a lateral structure.

11. The wafer stack according to claim 1, wherein the first metal post is formed by a metal material having a relatively high thermal conductivity.

12. The wafer stack according to claim 1, wherein the metal post runs through the first and the second substrates.

13. The wafer stack according to claim 1, wherein the first device layer comprises a low k porous material.

14. The wafer stack according to claim 1, wherein the device layer has a chip area forming thereon the circuit device and disposing thereon the first metal post.

15. The wafer stack according to claim 1, wherein the first metal post is vertically arranged between the first and second substrates.

16. The wafer stack according to claim 1, wherein the second substrate further comprises a second metal post passing through a rigid layer of the second substrate, wherein the second metal post and the first metal post are not electrically connected.

17. A wafer stack, comprising:
   a first wafer having a first substrate and a first device layer;
   a second wafer disposed above the first wafer and having a second substrate and a second device layer;
   a first and a second circuits disposed in the first and the second device layers, respectively;
   at least one via passing through the second substrate for electrically connecting the second circuit to the first device layer; and
   at least a first metal post existing in and penetrating through the entire first device layer, and arranged between the first and the second substrates, without being electrically connected to any one of the first circuit and the second circuit.

18. The wafer stack according to claim 17, wherein the first and the second wafers have the same line width.

19. The wafer stack according to claim 17, wherein the second wafer has a wider line width than that of the first wafer.

20. The wafer stack according to claim 17, wherein the second circuit comprises one selected from a group consisting of an ESD circuit, a passive element circuit, a driving circuit and a power/ground shielding circuit.

21. The wafer stack according to claim 17, wherein the second substrate further comprises a second metal post passing through a rigid layer of the second substrate, wherein the second metal post and the first metal post are not electrically connected.

22. A wafer stack, comprising:
a first wafer having:
 a device layer arranging therein at least a circuit; and
 a substrate mounting thereon the device layer;
a second wafer disposed above the first wafer; and
a first metal supporting structure existing in and penetrating through the entire device layer, and disposed between the substrate and the second wafer, without being connected to the circuit.

23. The wafer stack according to claim 22, wherein the device layer has a circuit area arranging thereon the at least one circuit and the first metal supporting structure.

24. The wafer stack according to claim 22, wherein the first metal supporting structure vertically extends from the substrate to the second wafer.

25. The wafer stack according to claim 22, wherein the second wafer further comprises a circuit layer.

26. The wafer stack according to claim 25, wherein the circuit layer is arranged to configure the first and the second wafers to be one of a face-to-face wafer stack and a back-to-face wafer stack.

27. The wafer stack according to claim 25, wherein the first metal supporting structure vertically passes through the device layer and the circuit layer.

28. The wafer stack according to claim 22, wherein the first metal supporting structure is one of a columnar structure and a lateral structure.

29. The wafer stack according to claim 22, wherein the first metal supporting structure runs through the substrate.

30. The wafer stack according to claim 22, wherein the second wafer further comprises a second metal supporting structure passing through a rigid layer of the second wafer, wherein the second metal supporting structure and the first supporting structure are not electrically connected.

31. A wafer stack, comprising:
a first circuit device having:
 a circuit layer comprising at least a circuit; and
 a substrate for mounting thereon the circuit layer; and
a second circuit device disposed above the first circuit device; and
a first stress protection device made of metal, existing in and penetrating through the entire circuit layer, and disposed between the substrate and the second circuit device, without being connected to the circuit.

32. The wafer stack according to claim 31, wherein the second circuit device further comprises a second stress protection device made of metal and passing through a rigid layer of the second circuit device, wherein the second stress protection device and the first stress protection device are not electrically connected.

33. A wafer stack comprising:
a first wafer having a circuit layer having therein at least a circuit and a first substrate;
a second wafer having a second substrate disposed above the first wafer; and
at least a first metal post existing in and penetrating through the entire circuit layer, and arranged between the first and the second substrates, without being electrically connected to the circuit.

34. The wafer stack according to claim 33 wherein the first metal post vertically extends from the first substrate to the second substrate.

35. The wafer stack according to claim 33, wherein the second substrate further comprises a second metal post passing through a rigid layer of the second substrate, wherein the second metal post and the first metal post are not electrically connected.

* * * * *